(12) United States Patent
Kempf et al.

(10) Patent No.: US 10,167,548 B2
(45) Date of Patent: Jan. 1, 2019

(54) CONTINUOUS SYSTEM

(71) Applicant: SINGULUS TECHNOLOGIES AG, Kahl Am Main (DE)

(72) Inventors: Stefan Kempf, Alzenau (DE); Holger Schramm, Dietzenbach (DE)

(73) Assignee: Singulus Technologies AG, Kahl Am Main (DE)

( * ) Notice: Subject to any disclaimer, the term of this patent is extended or adjusted under 35 U.S.C. 154(b) by 29 days.

(21) Appl. No.: 15/116,049

(22) PCT Filed: Dec. 11, 2015

(86) PCT No.: PCT/EP2015/079416
§ 371 (c)(1),
(2) Date: Aug. 2, 2016

(87) PCT Pub. No.: WO2016/102212
PCT Pub. Date: Jun. 30, 2016

(65) Prior Publication Data
US 2018/0195166 A1    Jul. 12, 2018

(30) Foreign Application Priority Data

Dec. 22, 2014 (DE) .................. 10 2014 226 780
Oct. 12, 2015 (DE) .................. 10 2015 219 668

(51) Int. Cl.
*B65G 29/00* (2006.01)
*C23C 14/56* (2006.01)
(Continued)

(52) U.S. Cl.
CPC .......... *C23C 14/566* (2013.01); *B65G 35/066* (2013.01); *C23C 16/54* (2013.01)

(58) Field of Classification Search
CPC ....................................................... B65G 29/00
(Continued)

(56) References Cited

U.S. PATENT DOCUMENTS 6,139,695 A * 10/2000 Washburn ............. C23C 14/352
                                                                    118/719
6,656,330 B2    12/2003 Matt
(Continued)

FOREIGN PATENT DOCUMENTS

DE        198 06 282 C1      3/1999
DE    10 2007 013 637 A1    9/2008
(Continued)

OTHER PUBLICATIONS

International Search Report dated Apr. 8, 2016 from PCT/EP2015/079416, 5 pages.
(Continued)

*Primary Examiner* — Saul Rodriguez
*Assistant Examiner* — Willie Berry, Jr.
(74) *Attorney, Agent, or Firm* — Ohlandt, Greeley, Ruggiero & Perle, L.L.P.

(57) ABSTRACT

A continuous system for transmitting accelerating forces and decelerating forces by interlocking, consisting of at least one carrier system having at least two connecting elements, a plurality of transport systems arranged one behind the other, wherein each transport system has a cam drum or cylindrical cam having a helical groove and the connecting elements of the carrier system are suitable for interlockingly engaging with the groove of the cam drum, and at least one motor, which drives the cam drums.

15 Claims, 13 Drawing Sheets

(51) Int. Cl.
*B65G 35/06* (2006.01)
*C23C 16/54* (2006.01)

(58) Field of Classification Search
USPC ......... 414/217, 218; 198/465.1, 467.1, 468.9
See application file for complete search history.

(56) References Cited

U.S. PATENT DOCUMENTS

2006/0280588 A1    12/2006  Blonigan et al.
2012/0031735 A1*    2/2012  Nishihara ............ B65G 35/066
                                                    198/468.11
2014/0069780 A1     3/2014  Iba

FOREIGN PATENT DOCUMENTS

DE    10 2007 054 091 A1      5/2009
EP          0 995 700 A1      4/2000
EP          2 053 649 A2      4/2009
JP         2013-237521 A     11/2013
WO        2008/008029 A1      1/2008
WO        2013/045110 A1      4/2013
WO       WO-2016102212 A1 *   6/2016  ............ B65G 35/066

OTHER PUBLICATIONS

Written Opinion dated Apr. 8, 2016 from PCT/EP2015/079416, 5 pages.
German Office Action dated Sep. 23, 2015 from German Patent Application No. 10 2014 226 780.3, 10 pages.

\* cited by examiner

CONTINUOUS SYSTEM

BACKGROUND

1. Field of the Disclosure

The present disclosure generally relates to the field of continuous systems, in particular clocked and continuously operating continuous systems having at least one processing chamber operated in a vacuum, such as, e.g., coating systems for coating semiconductor wafers, plastic parts or molded parts made of plastic, glass, metal or ceramics, etc.

2. Discussion of the Background Art

In commercial vacuum systems, in particular clocked vacuum systems for coating components, e.g. plastic parts, a high throughput and very short transport times, i.e. short dead times, should be achieved because the coating process must be interrupted during the transport time. In a clocked single substrate machine having very short cycle times/process times, productivity decreases because of the increasing share of the transport time in the cycle time (transport+process). An economical and technical realization does not make sense. Hence, a plurality of substrates must be brought simultaneously into the vacuum, leading to cycle time problems in connection with loading and separating the substrates in the lock. For this reason, carrier systems/carriers are used in production systems having a high throughput, which coat a plurality of substrates simultaneously. These carrier systems are loaded outside the lock and transferred into the lock as a unity/"quasi single substrate".

Known systems as described, e.g., in documents DE 198 06 282 C1, U.S. Pat. No. 6,656,330 B2 and WO 2013/045110 A1 are mostly rotary transfer machines being structured similar to the metalizing devices used in the optical disc industry. They mostly have a lock for introducing and removing the substrates, wherein mostly the locking mechanism of the lock is coupled with the substrate holding mechanism. Normally, these machines have a two-arm handling with two closure mechanisms which alternatingly close the lock or are in the exchange position for the substrates. These systems can achieve short cycle times in the lock station.

Known systems are also so-called continuous systems (in-line systems) as used, e.g., for coating glass. The movement (accelerating and decelerating forces) of the substrates to be coated is achieved by rotating driving rollers, wherein either the substrate itself or a carrier for the substrate lies on these rollers due to gravity, and the driving force is transmitted by friction. Thus, the achievable accelerations are low and the transport times are relatively high. Continuous systems are known, e.g., from documents DE 10 2007 054 091 A1 and EP 2 053 649 A2.

Conventional systems additionally use an indirect position control via sensors. In this connection, normally a first sensor is used and when this first sensor has been passed, the speed is reduced and a second sensor is approached at a remaining low creep speed for stopping. This is very time-consuming and it might happen that the positioning window is passed. Then the positioning window must be searched at a very low speed in the forward-backward operation. This process is again very time-consuming.

Normally, the carriers are guided and driven on roller stumps. Thus, almost the entire surface of the carrier remains free for coating (also from below). Moreover, the contact between carrier and roller stump is minimized so that in case the carriers are heated (sometimes temperatures of 400° C. are required) little energy is lost. However, in case of an unfavorable length to width ratio, the carriers can tilt on the roller stumps (drawer effect); this is why the carriers are normally moved with the short side forward through the system.

In the conventional systems it is possible that in case of narrow tolerances of carrier width, roller stump distances and low thermal expansions also the long side can be moved first through the system, but only up to a length to width ratio of 0.66:1. Starting from a length to width ratio (L-W ratio) of about 0.5:1, the carrier system can possibly tilt in the transport plane and thus cannot be transported further.

As the length decreases, it is possible that a substrate tilts out of the transport plane. In order to avoid this, always at least two rollers are required for supporting the substrate. The pitch of the roller distances must thus be <0.5*L. This would lead to a lot of rollers and small roller distances because L<0.5*B. All rollers would have to be driven. Mostly, for each roller the rotational movement is led from the atmosphere side via a rotary feedthrough into the vacuum.

The known systems can be distinguished in accordance with the orientation of the substrates: Horizontal and vertical systems. Both system types are available with and without carrier. In the horizontal systems it is further possible to distinguish between systems with continuous rollers and systems with short roller stumps at both sides of the process chamber. The latter are mostly used in connection with carriers. For being able to guide the carrier, the roller stumps are often provided with a chamfered shoulder (similar to a train wheel). The distance between the shoulders must be larger than the width of the carrier in order to avoid jamming. This play, however, allows a certain inclination of the carrier which, upon contact with the chamfered shoulder of the roller stumps, is jerkily corrected again and again. In case a system is operated at different temperatures, the thermal expansion must be taken into consideration when dimensioning the play.

Alternatively, the roller stumps can be profiled. In cooperation with a profile rail at the carrier, this profile then takes over the task of guidance. The other roller side remains unprofiled and can compensate for the thermal expansions.

Vertical systems can again be distinguished in view of whether the substrate is transported in a perpendicular or inclined manner (mostly by about 7°) through the system. In these system types, the substrates or carriers are mostly standing with their own weight on the lower rollers, which perform driving. These rollers are profiled and guarantee guidance in cooperation with a profile rail. The upper side of the carriers mostly comprises a device which guarantees the vertical orientation of the carrier. In case of inclined substrates and carriers, this function can also be performed by supporting rollers. All variants listed so far transmit the driving force onto the substrate and/or carrier by friction and, therefore, are not free of slip.

Vertical systems have sporadically also been built with an overhead drive system. Also a magnetic drive and guidance system (similar to Transrapid) has already been realized.

It is the object underlying the present disclosure to provide a device for achieving short cycle times and a high throughput in a clocked or continuously operating continuous system. Moreover, it is an object of the disclosure to achieve an exact and reliable positioning in such systems. Hence, an efficient and low-cost coating of components in a continuous system should be achieved. Moreover, the above-described ratio of carrier length and carrier width of 0.6:1 should be extended and the disadvantage of narrow tolerances and the temperature limit should be overcome. This should lead to a reduction in the system length in order to thus achieve a high throughput. It is furthermore an object of the present disclosure to provide a precise guidance and a force transmission caused by interlocking.

SUMMARY

The present disclosure provides for a continuous system for transmitting accelerating and decelerating forces by means of interlocking. The continuous system comprises at least one carrier system with at least two connecting elements and a plurality of transport systems arranged one after the other in the transport direction in a transport plane. The transport systems each have a cylindrical cam being axially parallel with respect to the transport direction, wherein the cylindrical cams have a central region having a first diameter $d_1$ and at least a second diameter $d_2$ at the ends of the cylindrical cams, wherein $d_2<d_1$. The distance between two successive central regions of the cylindrical cams is smaller than the distance between the at least two connecting elements of a carrier system. In the central region, the cylindrical cams have a helical groove or a helically curved web, and the connecting elements of the carrier system engage interlockingly with the groove of the cylindrical cam or encompass the curved web. The transport systems comprise at least one processing chamber with at least two vacuum locks for a vacuum operation of the processing chamber, wherein the processing chamber comprises an inner chamber wall and a recess in which the cylindrical cam is arranged, wherein a distance a of the cylindrical cam axis relative to the inner chamber wall lies in the range of $d_2/2<a<d_1/2$. The continuous system further comprises at least one drive unit (e.g. a motor or an upright shaft) for driving the cylindrical cams. The above-mentioned condition for the distance a of the cylindrical cam axis relative to the inner chamber wall of the processing chamber accordingly also applies to possible further chambers of the continuous system.

The cylindrical cams are preferably arranged coaxially, i.e. it is preferred that the cylindrical cam axes are arranged along a straight line.

According to an embodiment of the present disclosure, the connecting element may comprise a plurality of runners being supported so as to be rotatable.

According to an alternative embodiment of the present disclosure, the connecting element may comprise one or more pin-shaped elements.

The transport systems may comprise a loading and unloading chamber and/or a charging and discharging chamber and/or at least one processing chamber.

The charging and discharging chamber and/or the at least one processing chamber may additionally comprise vacuum locks and may be suitable for being operated under vacuum.

According to the disclosure, each of the plurality of transport systems may comprise its own motor (drive unit). Moreover, two or more transport systems may share a motor and other transport systems may have their own motor. In other words, the transport systems may comprise a motor which drives all transport systems or the transport systems comprise at least two motors wherein each of them drives at least one transport system.

According to the disclosure, the motors may each comprise an encoder, wherein the encoder is suitable for determining the position of the carrier systems. The angular position of the encoder is directly related with the angular position of the cylindrical drum so that the carrier position can be determined exactly in connection with a shift register.

The at least one carrier system may be longer in the transport direction in the transport plane than perpendicularly to the transport direction in the transport plane and longer than perpendicularly to the transport plane. In other words, the transport system may be longer than wide and high, wherein the length relates to the extension along the transport direction (z-direction) and the width relates to an extension perpendicularly to the transport direction in the plane defined by the transport direction and the connection (x-direction) between the center of the cylindrical cam and the engagement point of the connecting element with the cylindrical cam.

Alternatively, the at least one carrier system may be shorter in the transport direction in the transport plane than perpendicularly to the transport direction in the transport plane and/or shorter than perpendicularly to the transport plane, preferably at a ratio of 0.3-0.5:1. In other words, the carrier system may also be shorter than wide and/or high. The height is defined by the normal on the transport plane. If a carrier system (carrier) is, e.g., 100 mm shorter, a system comprising four chambers would be 100 mm shorter per chamber, i.e. a total of 400 mm shorter. The system would not have to become wider because the continuous transport speed remains the same in the area of the process path.

Moreover, the device of the disclosure may comprise a friction-involving guide system which preferably comprises a first guide element and a second guide element, wherein the first guide element is arranged at the side of the carrier system with the connecting element and the second guide element is arranged at the opposite side of the carrier system.

The transport systems may comprise at least one processing chamber with at least one first buffer chamber, at least one process chamber following the at least one buffer chamber, and at least one second buffer chamber following the at least one process chamber.

The continuous system may further comprise means for individually controlling the plurality of transport systems for a continuous running of the carrier systems in a processing chamber and/or for adjusting a predetermined distance between the successively arranged carrier systems.

Preferably, at least one end (or also both ends) of the cylindrical cams having the diameter $d_2$ is led outwardly through at least one wall of the recess in order to be driven there by the drive unit. In other words, the end(s) of the cylindrical cams are preferably led through the wall (wall perpendicular to the transport direction) of the recess to atmosphere in order to drive the cylindrical shafts by means of the drive unit.

The depth of the groove is preferably greater than the length of the connecting elements in the depth direction of the groove, preferably in the radial direction of the cylindrical cam. The maximum insertion depth of the connecting elements d must lie in the range of $0<d<=0.5*d_1$. The insertion depth of the connecting elements into the groove and thus the distance between the connecting elements and the inner chamber wall is preferably adjusted by the guide system.

The distance a of the cylindrical cam axis relative to the inner chamber wall is preferably defined by the sum of a chamber wall thickness w, the radius of the drive pinion/functional element r/2 and a gap between the functional element and the chamber wall s.

In the following, the present disclosure will be explained in more detail on the basis of preferred embodiments and the Figures.

DETAILED DESCRIPTION OF THE PREFERRED EMBODIMENT

Figure 1:
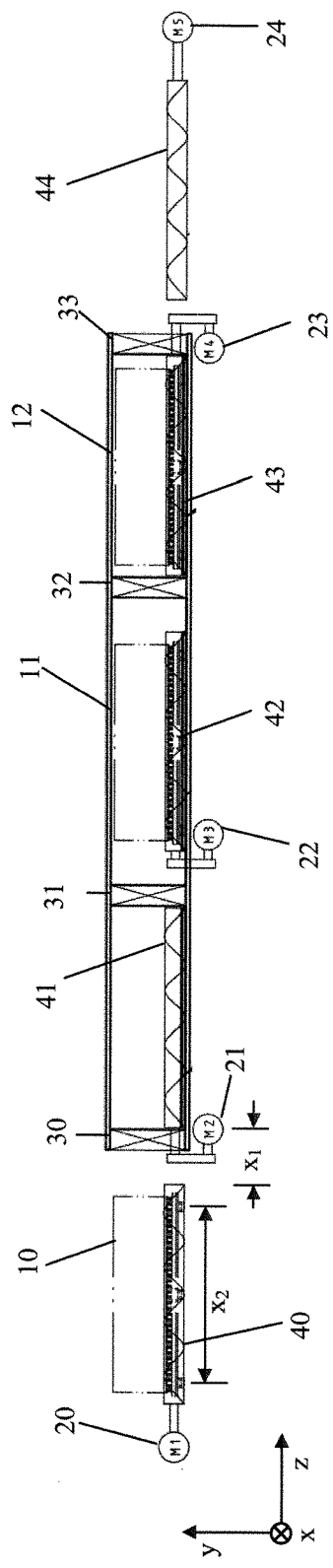
FIG. 1 schematically shows the structure of an exemplary embodiment of the solution according to the disclosure.

A preferred embodiment of the disclosure is schematically shown in FIG. 1. FIG. 1 shows a total of three carrier systems 10, 11, 12, four vacuum locks 30, 31, 32, 33 and five cylindrical cams 40, 41, 42, 43, 44 with motors 20, 21, 22, 23, 24.

The coordinate system shown in FIG. 1 defines the directions or planes of the systems and, in the following, is used uniformly for the further Figures. The transport direction is defined along the z-axis. Perpendicular with respect to the transport direction, the x-axis is defined, wherein the x-axis and the z-axis lie in one plane (transport plane) or define this plane. The y-axis is perpendicular (normal direction) with respect to the plane defined by the x-axis and the z-axis.

According to FIG. 1, the system comprises five cylindrical cams 40-44 which are separated by vacuum locks 30-33. The region of the cylindrical cams 41, 42, 43 along the z-axis (which, in the shown example, lies in the horizontal direction) defines together with the limiting vacuum locks 30-33 a respective process chamber. The first cylindrical cam 40 and the rear cylindrical cam 44 follow the system's transport system (not shown) and can be referred to as loading and unloading stations. In this exemplary embodiment, these two cylindrical cams 40, 44 are not in a vacuum. The loading station is followed by three vacuum chambers (process chambers). The middle one of these three chambers is the coating chamber (processing chamber) in which the components are coated. The chamber comprising the cylindrical cam 41 is a so-called charging chamber and the chamber comprising the cylindrical cam 43 is a so-called discharging chamber. In the re-supply path (not shown), the substrates can be changed independent of the clock and/or loaded and unloaded separately. Thus, the handling system has a large time frame so that a plurality of substrates can be processed on the carrier systems 10-12.

The cylindrical cams 40-44 are driven separately by motors 20-24. According to the disclosure, each cylindrical cam 40-44 forms a cylinder having a helical groove or a helically curved web. The carrier systems 10, 11, 12 comprise, e.g., runners being supported so as to be rotatable in order to engage interlockingly with the helical groove or the helically curved web. Alternatively to the runners being supported so as to be rotatable, also other configurations are conceivable, e.g. a pin-shaped element, as long as it is suitable for engaging with the helical groove or cooperating with the helically curved web in order to transmit the accelerating and decelerating forces by means of interlocking. The cylindrical cams 40-44 are each interrupted at the transitions to the next process chamber. It is thus necessary to provide the carrier systems 10-12 with a plurality of offset runners in order to guarantee a continuous engagement of the runners with the groove or the curved web of the cylindrical cams 40-44. The described interruptions of the cylindrical cams 40-44 are optional and the cylindrical cams 40-44 can also be continuous and can be driven by only one motor. Moreover, the distance $x_1$ between two successive cylindrical cams should be smaller than the distance (offset) $x_2$ between at least two runners or pins, e.g., of the rearmost and the foremost runners or pins of a carrier system. It is thus guaranteed that the distance $x_1$ can be bridged by the arrangement of the runners or pins.

The arrangement and the number of process chambers with the cylindrical cams 40-44 is described herein only exemplarily. It is of course possible that a continuous system operates with more or less process chambers than described herein. Depending on the specific process requirements, the requirements can thus be adapted to the overall system. A coating process or processing could, e.g., also be performed without a charging and a discharging chamber. Also recharging chambers between different pressure levels are possible. However, an embodiment comprising a plurality of successive coating or processing chambers is particularly preferred, wherein the number of charging and discharging chambers remains constant.

Figure 2:
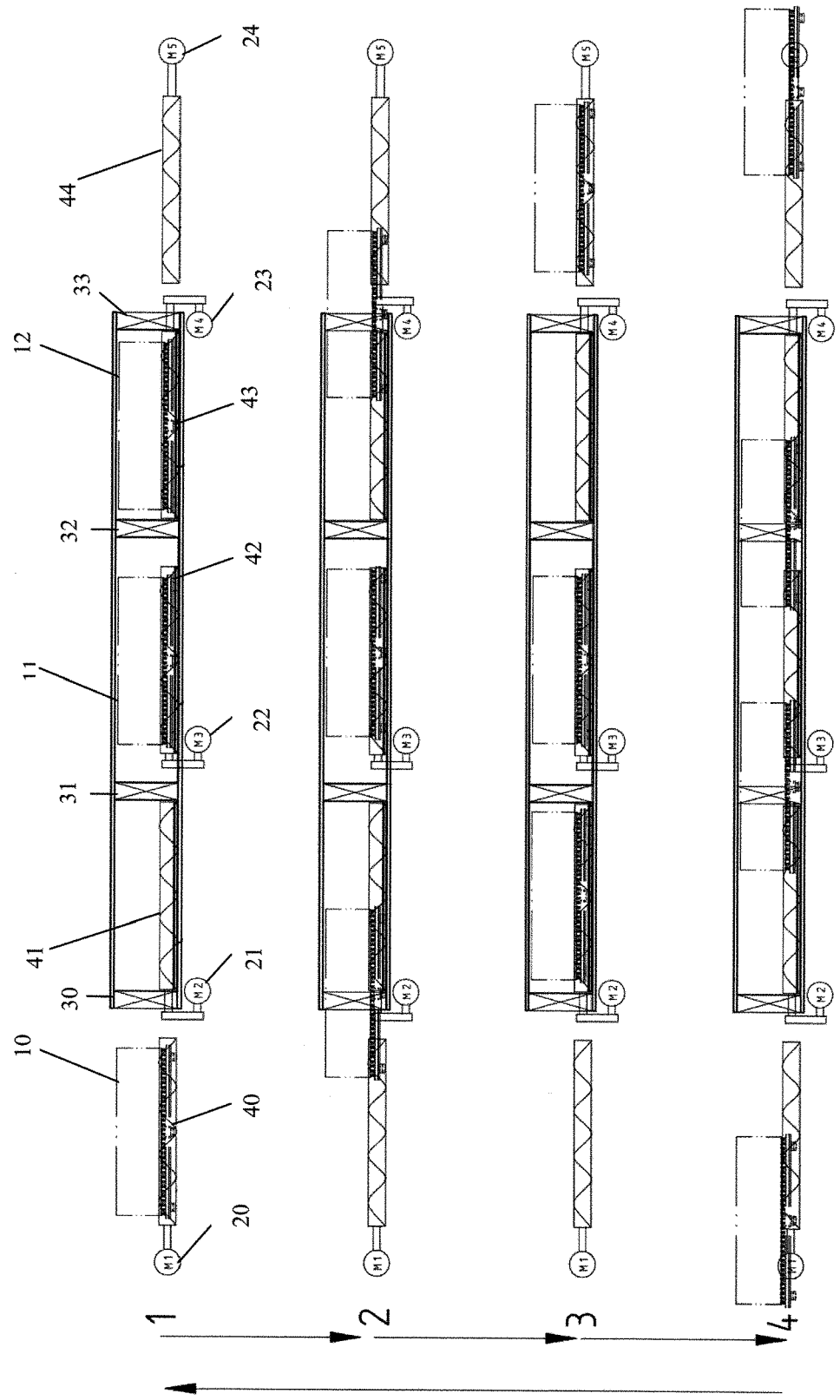
FIG. 2 shows a flow chart of the exemplary embodiment according to FIG. 1.

FIG. 2 shows a flow chart according to the embodiment of FIG. 1. In a first step, a first carrier system 10 is in the loading station with the cylindrical cam 40. A second carrier system 11 is in the coating chamber with the cylindrical cam 42 under vacuum, and a third carrier system 12 is in the discharging chamber with the cylindrical cam 43. The charging and discharging chambers are flooded and the vacuum locks 30 and 33 are opened. During this time, the carrier system 11 is in the coating chamber where the components can be coated. The cylindrical cams 40 and 44 can run synchronously with the system's transport system (not shown) in order to allow a continuous and time-saving operation of the system.

In a second step, the cylindrical cams 40, 41, 43, 44 are driven by the motors 20, 21, 23, 24. The carrier system 10 is thus moved into the charging chamber and the carrier system 12 is moved out of the discharging chamber. The cylindrical cam 42 is not moved in this step so that coating of the components can be continued.

In a third step, the vacuum locks 30 and 33 are closed as soon as the carrier system 10 is in the charging chamber and the carrier system 12 is in the unloading station. The cylindrical cams 40 and 44 can run further with the system's transport system. The carrier system 11 is still in the coating chamber. The charging and discharging chambers are evacuated in order to generate a vacuum in these chambers. Then, the coating process is terminated and the vacuum locks 31 and 32 are opened.

In a fourth step, a new carrier system is advanced by the system's transport system to the loading station and the carrier system 12 is transferred by the unloading station to the system's transport system. Moreover, the carrier systems 10 and 11 are moved by the cylindrical cams 41, 42, 43 into the respective adjacent chambers and the vacuum locks 31 and 32 are closed. Subsequently, the process can start from the beginning with step 1.

Because of the interlocking arrangement, the transport times of the carrier systems can be reduced because a higher transport speed than in conventional systems can be used. The process steps described above are described herein only exemplarily. A different control or clocking of the individual cylindrical cams 40-44 can be adapted depending on the specific process requirements and process parameters.

Figure 3:
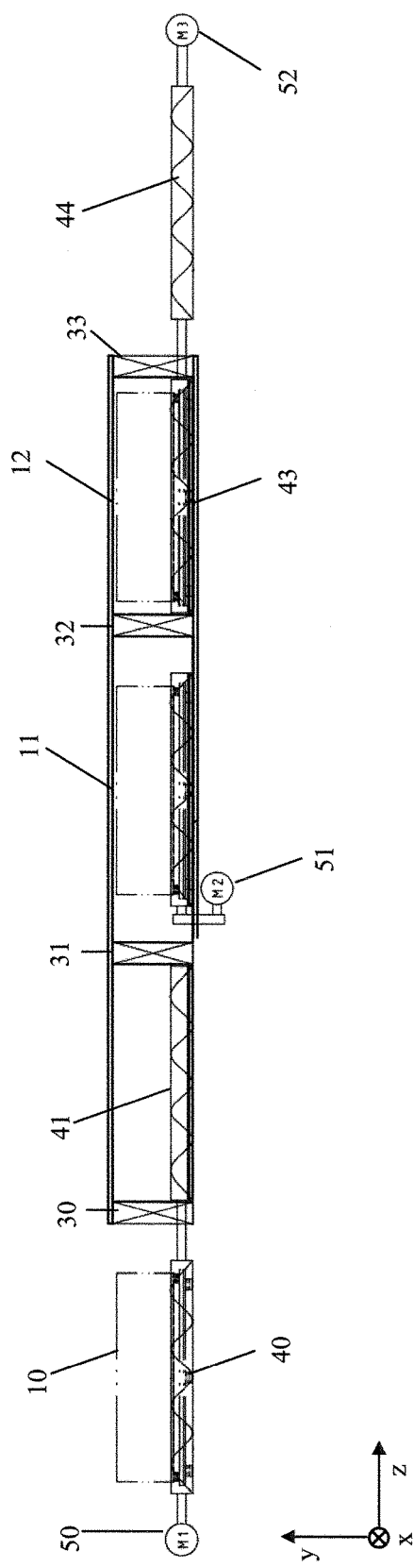
FIG. 3 schematically shows the structure of a further exemplary embodiment of the solution according to the disclosure.

FIG. 3 schematically shows a further exemplary embodiment of the present disclosure. Elements which have already been described in FIG. 1 and FIG. 2 have the same reference numbers in FIG. 3 and will not be described once again in the following. In contrast to the first embodiment of FIG. 1 and FIG. 2, the cylindrical cams 40 and 41, as well as 43 and 44, are mechanically connected with each other. In this embodiment, the cylindrical cams 40 and 41 are driven by one motor 50 only. The cylindrical cams 43 and 44 are driven by the motor 52 and the cylindrical cam 42 is driven by the motor 51. This structure leads to the flow chart described below on the basis of FIG. 4.

Figure 4:
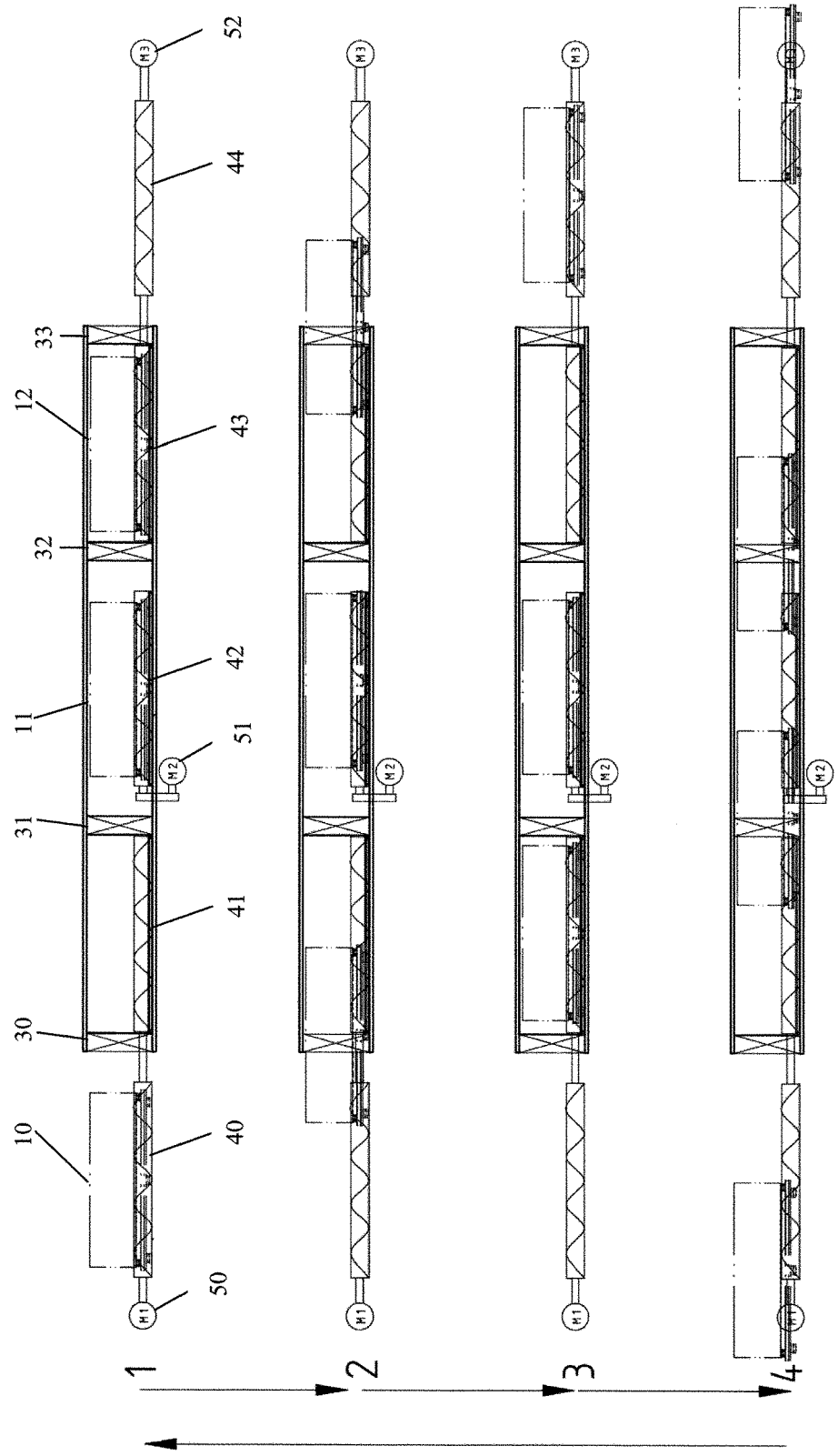
FIG. 4 shows a flow chart of the exemplary embodiment according to FIG. 3.

FIG. 4 describes a flow chart for the second embodiment of the present disclosure. The substantive difference vis-à-vis the flow chart of the first embodiment of FIG. 2 becomes clear in steps 2 and 4. According to FIG. 4, in step 2 the cylindrical cams 40 and 41, as well as 43 and 44, are only driven by the two motors 50 and 52, while the cylindrical cam 42 with motor 51 is not moved in step 2. In step 4 in turn all cylindrical cams 40-44 move, respectively driven by the three motors 50, 51, 52.

In contrast to the first flow chart of FIG. 2, in clock 4 the new carrier system can only be moved synchronously to the movement of the carrier system 10 out of the charging chamber into the coating chamber. In FIG. 2 this could also be an own clock because the cylindrical cams 40 and 41 are not coupled mechanically.

In accordance with the disclosure, the transport times of the carrier systems 10-12 are also reduced in the second embodiment because of the interlocking drive. Because of the reduced number of motors, i.a. the costs for the system can be reduced. However, it might be necessary to use motors having a higher power and a higher torque.

The motors 20-24 and 50-52 of the embodiments described above are preferably servo motors having corresponding encoders (not shown). An exact and reliable positioning of the carrier systems can thus be achieved, so that the process times can be reduced further.

Figure 5:
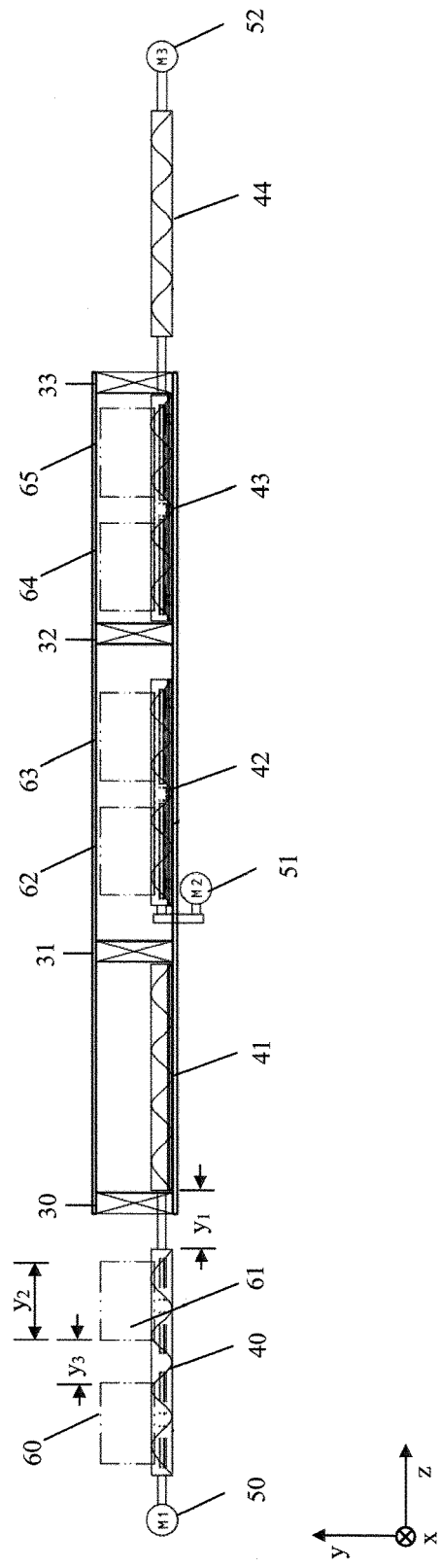
FIG. 5 schematically shows the structure of a further exemplary embodiment of the solution according to the disclosure.

FIG. 5 shows a further exemplary embodiment of the present disclosure. The substantive difference vis-à-vis the embodiment of FIG. 3 is the fact that the carrier systems 10-12 are divided in carrier system pairs 60 and 61, 62 and 63, 64 and 65. The carrier system pairs 60 and 61, 62 and 63, 64 and 65 are substantially ranged one after the other in a defined manner and can be moved synchronously. As already described above on the basis of FIG. 1, it should be possible to bridge the distance $y_1$ between two successive cylindrical cams, e.g. cylindrical cams 40 and 41, by the respective carrier system 60, 61, 62, 63, 64, 65 in that at least two runners or pins, e.g. the rearmost and the foremost runner or pin, of the respective carrier system (e.g. carrier system 61) have a larger distance $y_2$ than $y_1$. Moreover, the distance $y_3$ between the two carrier systems arranged directly after each other, e.g. carrier systems 60 and 61, should be larger than the distance $y_1$. However, a double-start cylindrical cam also allows a smaller distance of $y_3$ than the distance $y_1$.

Figure 6:
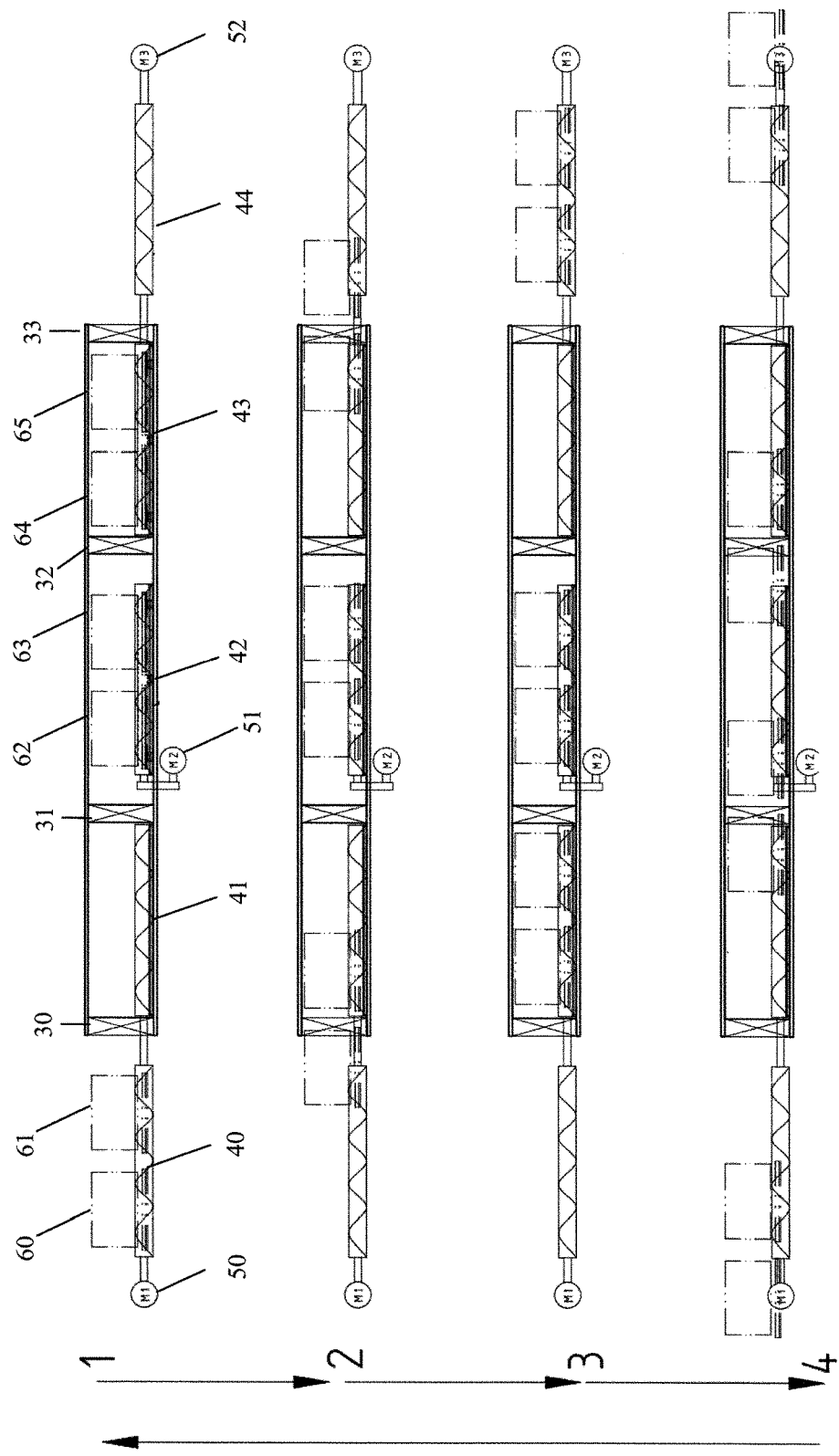
FIG. 6 shows a flow chart of the exemplary embodiment according to FIG. 5.

FIG. 6 shows the flow chart according to the embodiment of FIG. 5 in a manner analogously to the flow chart of FIG. 4. Although the embodiment according to FIGS. 5 and 6 is shown analogously to the embodiment of FIGS. 3 and 4 with three motors 50, 51, 52 each, the person skilled in the art can easily notice that the embodiment according to FIGS. 5 and 6 is not restricted to the number of motors used. For example, a combination of the embodiment according to FIGS. 1 and 2 as well as according to FIGS. 5 and 6 can, e.g., be realized easily.

Figure 7:
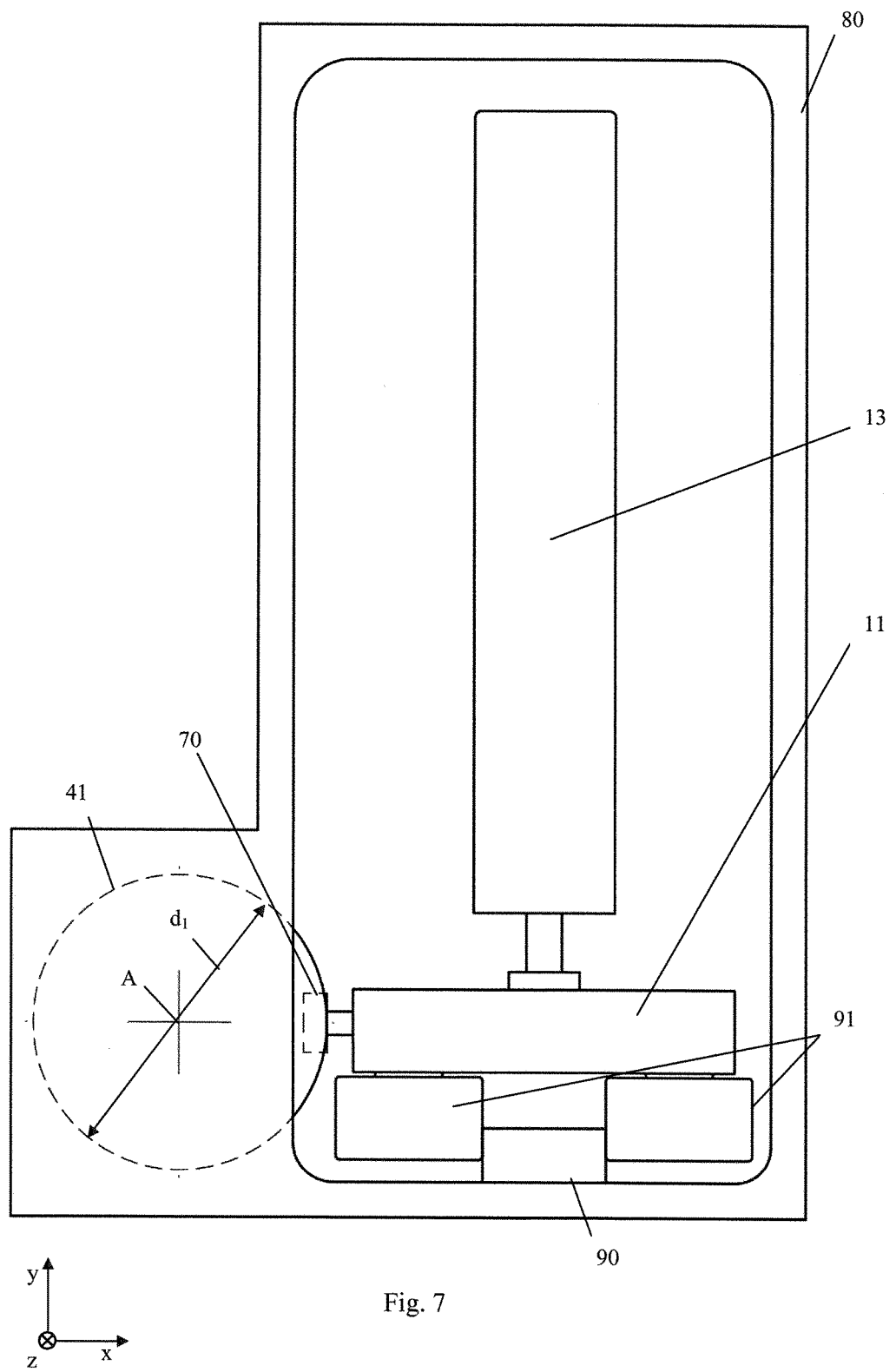
FIG. 7 shows the principle structure of the interlocking drive device according to the disclosure.

FIG. 7 describes the interlocking drive according to the disclosure in more detail. FIG. 7 exemplarily shows a cylindrical cam 41, a carrier system 11 (cf. FIG. 1), a substrate 13 as well as a connecting element 70 (roller or pin) being supported so as to be rotatable. The cylindrical cam 41 is a cylinder having a helical groove or a helically curved web with which the connecting element 70 (e.g. the runner) of the carrier system 11 is interlockingly engaged. It is thus possible to transmit the accelerating and decelerating forces by means of interlocking. Consequently, the achievable accelerations are high and the transport times are relatively short. The transport direction (along the z-axis) thus extends along the main axis (cylinder axis) of the cylindrical cams 41. The transport plane is clearly defined by the transport direction (z-axis) and the radius of the cylindrical cam 41 relative to the engagement point of the connecting element 70 with the groove or the curved web (x-axis). In other words, the transport plane is defined by the transport direction and the perpendicular connection between the cylinder axis of the cylindrical cam 41 and the engagement point of the connecting element 70 with the groove or the curved web (transport plane=plane of x-axis and z-axis). The definition of the transport plane can be applied in particular to the embodiment shown herein. However, other embodiments of the present disclosure can deviate from this definition, e.g., when using a non-straight connecting element (z-shape or step-shape), in which the engagement point of the connecting element 70 does not lie in the transport plane.

FIG. 7 moreover shows exemplarily the inlet and outlet opening of a chamber 80 (e.g. of the coating chamber). The opening is selected such that the carrier system 11 including the connecting element 70 just fits through. The axis of the cylindrical cam 41 and its diameter and/or groove depth are selected such that the groove lies in the region of the opening of the chamber 80 in order to be able to receive the connecting element 70 (roller or pin). The axis A of the cylindrical cam 41 including the drive shaft and the rotary feedthrough thus lie outside the opening of the chamber 80. As shown in FIG. 7, a guide rail 90 and corresponding guide rollers 91 can be provided for moving the carrier system 11 efficiently and reliably.

In other words, as shown in FIG. 7, a part of the cylindrical cam 41 projects in the direction of feed into the opening 80 formed by the chamber. This part of the cylindrical cam 41 can be engaged with the connecting element 70 in order to transmit the feed.

Figure 7A:
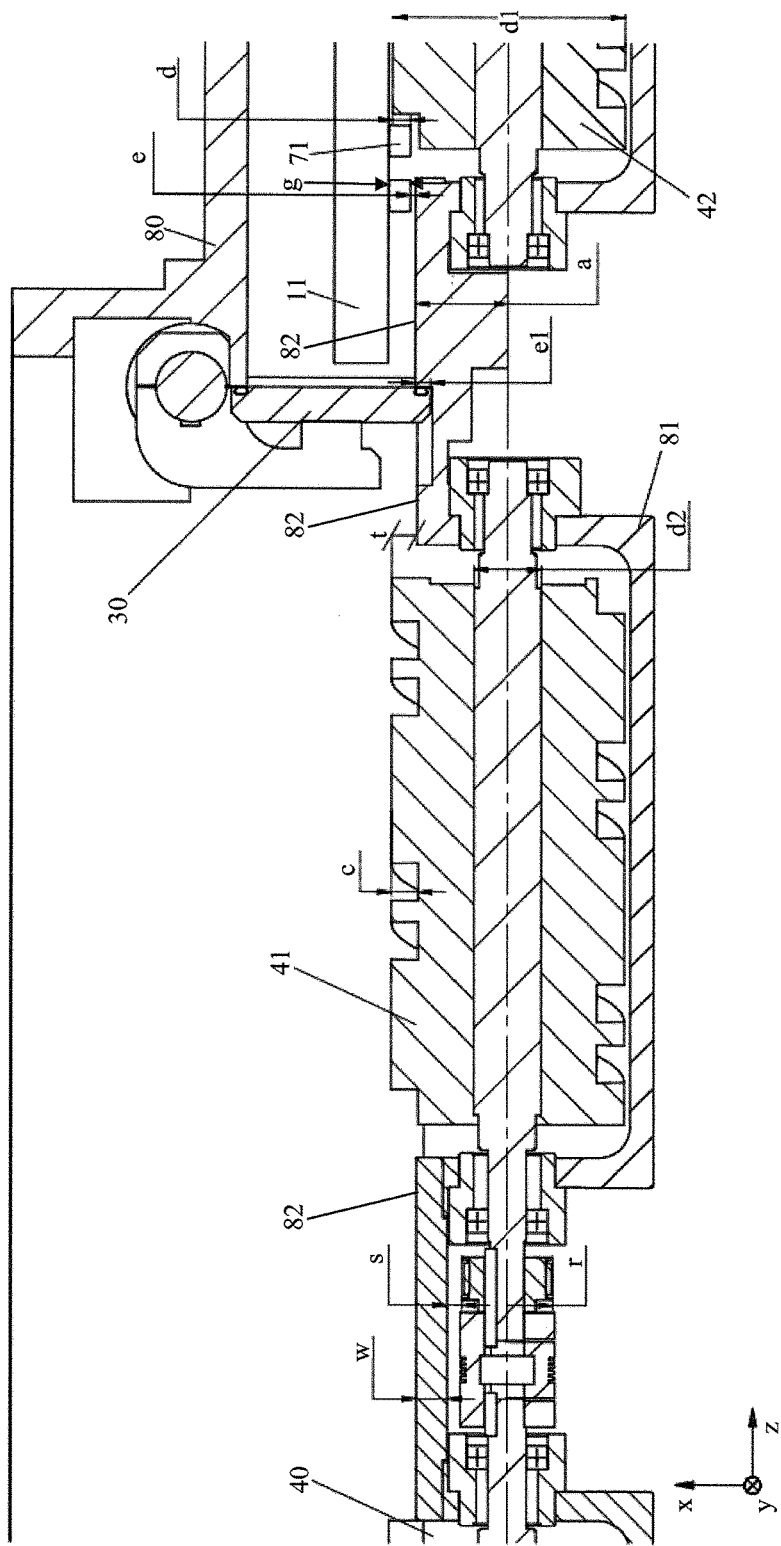
FIG. 7a shows a section of a schematic structure of a vacuum system according to an exemplary embodiment according to the disclosure.

FIG. 7a shows an exemplary arrangement according to the present disclosure comprising a vacuum lock 30, three cylindrical cams 40, 41, 42, a carrier system 11 with two connecting elements 70, 71. The opening of the chamber 80 is defined by the chamber wall and has preferably at least one inner chamber wall 82, which has a step e1 at the position of the vacuum lock 30 to form a perpendicular sealing surface. The sealing surface is characterized in that it allows sealing of the opening of the chamber 80 and the vacuum lock 30 in that the vacuum lock 30 is pressed against the perpendicular surface formed by the step (recess) e1.

FIG. 7a exemplarily shows a vacuum lock 30 which can be opened and closed by a rotational movement (rotational movement is indicated by dashed line). The vacuum lock is placed such that it does not collide with the cylindrical cam also during opening and closing (see dashed line). Other vacuum locks such as, e.g., a linearly movable slide (the disturbing contour of which would be smaller) are also conceivable.

As shown in FIG. 7a, the respective chamber has a recess 81 in which the respective cylindrical cam 40, 41, 42 is inserted. The axial distance a (axis of the cylindrical cam) relative to the inner chamber wall is defined by the wall thickness w of the chamber+radius of the drive pinion/functional element r/2+gap s between the functional element and the chamber wall.

The cylindrical cam 40, 41, 42 has a central region having a first diameter $d_1$ and at least a second diameter $d_2$ at the two ends of the cylindrical cam 40, 41, 42, wherein the second diameter $d_2<d_1$. The diameter $d_2$ can be further reduced towards the outermost ends of the cylindrical cam. The two ends of the cylindrical cam 40, 41, 42 are driven outside the sealing region of the chamber(s) by a functional element (e.g. drive pinion, rotary feedthrough). For this purpose, at least one end, preferably both ends, of the cylindrical cam 40, 41, 42 are led out of the perpendicular walls formed by the recess in order to be driven in atmosphere by the functional element (drive element). For this purpose, the depth of the recess should be greater than the sum of axial distance a and half the diameter of the cylindrical cam $d_1/2$, wherein the distance between the cylindrical cam a and the inner chamber wall 82 lies in the range of $d_2/2<a<d_1/2$.

Cylindrical cams 40, 41, 42 can be arranged in a manner spaced from each other (such as, e.g., cylindrical cams 41, 42) or can be formed continuously at a drive train (such as, e.g., cylindrical cams 40, 41). By using a smaller diameter at the ends of the cylindrical cams 40, 41, 42, it is achieved in both cases that a vacuum lock 30 can be inserted.

The diameter $d_1$ of the central region is selected such that the cylindrical cam 40, 41, 42 projects from the inner wall of the chamber. In other words, the wall thickness of the side of the opening of the chamber 80 on which the cylindrical cam 40, 41, 42 is arranged is selected such that the cylindrical cam 40, 41, 42 projects from the inner side of this side of the wall, wherein the cylindrical cam is inserted into the recess 81. Preferably, the recess 81 has four substantially perpendicular wall portions having the length (extension in the x-direction, i.e. perpendicular to the transport direction) and a horizontal wall portion connecting the four perpendicular wall portions. The horizontal wall portion of the recess has a length (extension in the z-direction) which is longer than the extension of the central region of the cylindrical cam in the z-direction (transport direction). In other words, the diameter of the cylindrical cams 40, 41, 42 should be dimensioned sufficiently large for being able to bring a drive shaft outside the sealing region of a lock flap (vacuum lock) through the chamber wall to atmosphere. Thus, the rotational movement can be caused outside the chamber (in the atmosphere), e.g. by means of a toothed belt and pinions. Moreover, the diameter of the cylindrical cams 40, 41, 42 should project into the chamber opening 80 by at least the length t so that the connecting elements 70, 71 can engage with the groove of the cylindrical cam. The length g of the connecting elements 70, 71 and the insertion depth d of the connecting elements 70, 71 into the groove of the cylindrical cam should meet the relation g>d.

The helical groove is provided in the central region of the cylindrical cam 40, 41, 42. In an exemplary embodiment, the depth c of the groove can extend up to at least the height of the inner wall of the chamber. In this embodiment, the insertion depth d of the connecting elements 70, 71 into the groove is determined by the length g of the connecting elements 70, 71, wherein the length d<c and d<g. The distance between the connecting element and the axis must be larger than the axial distance a so that the carrier system 11 and/or the connecting elements 70, 71 do not abut against the chamber wall when being transferred from one chamber into the following chamber because the connecting elements 70, 71 have a distance e>0 relative to the chamber wall.

FIGS. 1 to 6 describe embodiments in which the carrier systems 10-12, 60-65 are longer in the transport direction in the transport plane than perpendicular to the transport direction in the transport plane. In other words, the length of the carrier systems 10-12, 60-65 in the transport direction (along the z-axis) exceeds the width of the carrier systems 10-12, 60-65 (along the x-axis).

Figure 8:
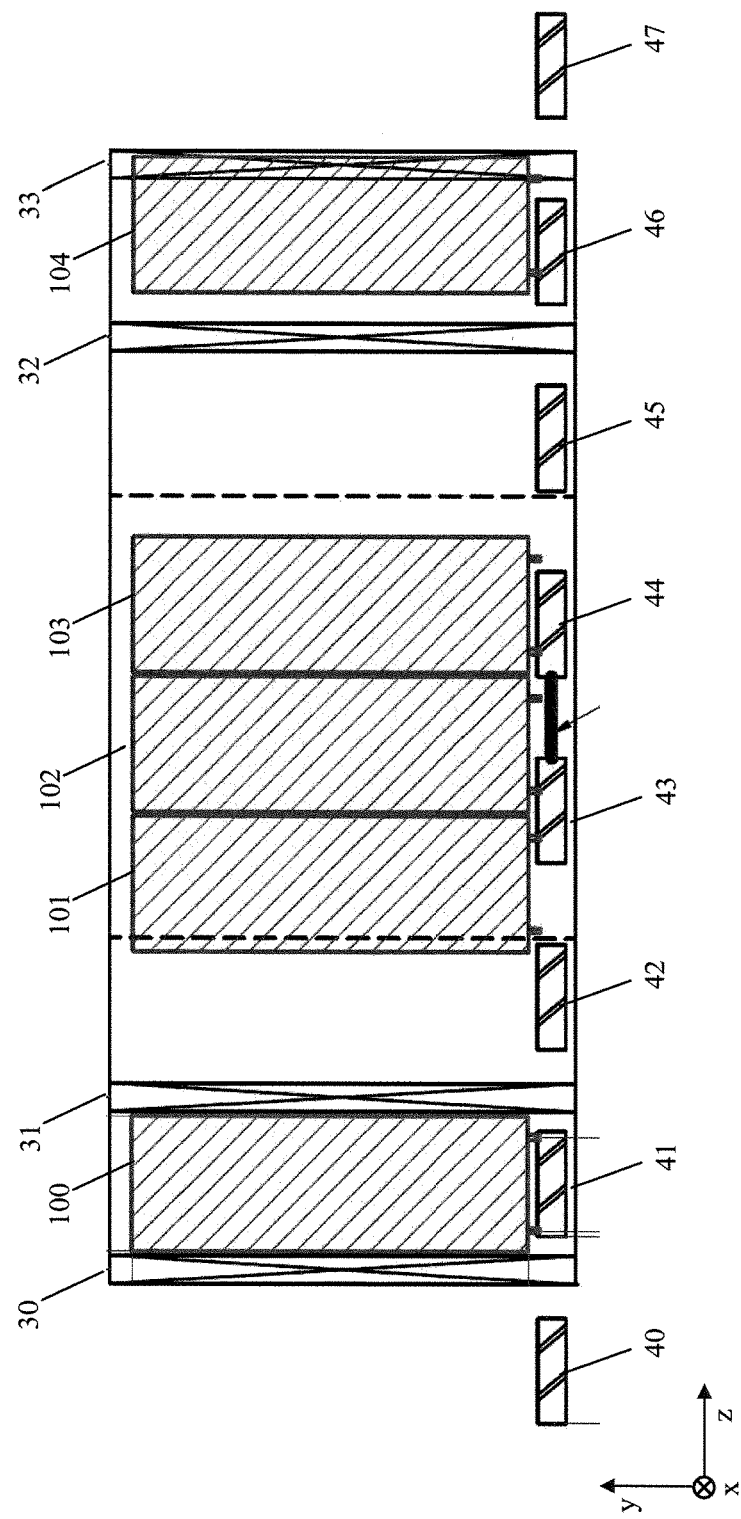
FIG. 8 schematically shows the structure of a further exemplary embodiment of the solution according to the disclosure.

FIG. 8 shows a further alternative embodiment of the present disclosure, wherein the carrier systems 100-104 are shorter in the transport direction in the transport plane (along the z-axis) than perpendicularly to the transport plane (along the y-axis) with a length to width ratio of preferably 0.3-0.5:1. In other words, the width of the carrier systems 100-104 (along the y-axis) exceeds the length of the transport systems 100-104 (along the z-axis), i.e. the carrier systems 100-104 are moved with the long side forward through the system. It is thus possible to reduce the length of the overall system as compared to the embodiments of FIGS. 1 to 6, wherein the conveying speed remains the same, and a shorter throughput time of the carrier systems 100-104 can be achieved. Moreover, the coating chamber (processing chamber) of FIG. 8 comprises a process chamber (see dashed lines) which is enclosed by two buffer chambers. The cylindrical cams 43 and 44 of the process chamber are mechanically coupled and can be controlled with the same speed. The two mechanically coupled cylindrical cams 43, 44 can of course also be configured as one single cylindrical cam. The other cylindrical cams 40-42 and 45-47 can charge and discharge the carrier systems 100-104 in a clocked manner by controlling them differently. Thus, the carrier systems can be moved continuously in the region between the vacuum locks 31, 32 in the process chamber on the cylindrical cams 43, 44, and between the transport systems 100-104 a minimal gap can be realized.

Figure 9:
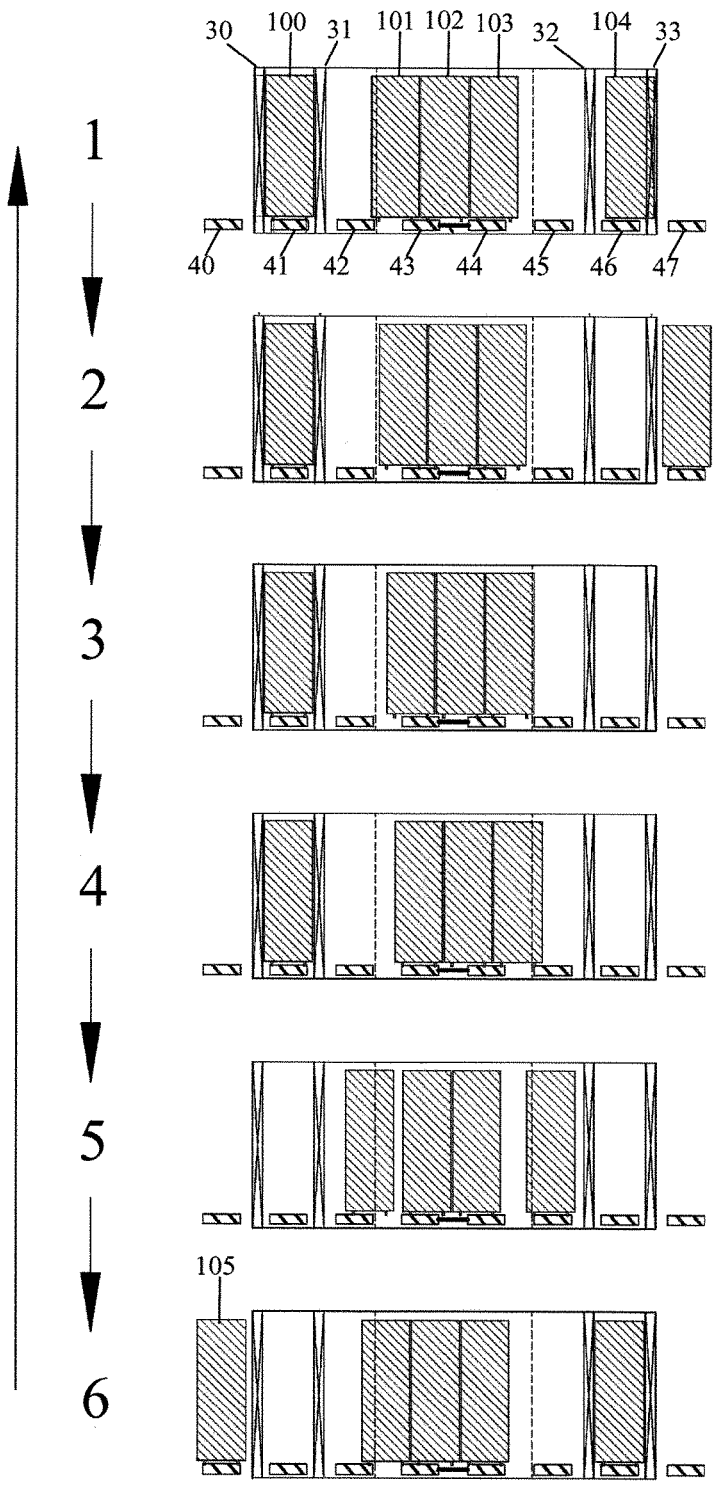
FIG. 9 shows a schematic rough flow chart of the exemplary embodiment according to FIG. 8 of the solution according to the disclosure.

FIG. 9 shows a rough flow chart according to the alternative embodiment of FIG. 8. In a first step, the carrier system 100 is already in the charging chamber. The carrier systems 101-103 are in the coating chamber, and a further carrier system 104 is just moving out of the discharging chamber towards the unloading station. In a second step, the carrier system 104 is already in the unloading station and the carrier systems 101-103 have moved further in the coating chamber at a constant speed. In a third step, the carrier system 104 is already further on the system's transport system (not shown) and the carrier systems 101-103 have moved further in the coating chamber. In a fourth step, the carrier systems 101-103 have moved at a constant speed. In a fifth step, the carrier system 101 moving ahead of carrier system 100 catches up. In a sixth step, the carrier system 103 is already in the discharging chamber, the carrier systems 100-102 are in the coating chamber, and a new carrier system 105 is in the loading station.

The rough flow chart described above thus allows a constant speed of the carrier systems on the cylindrical cams 43, 44 (constant drive with v=carrier distance/cycle time, e.g. 600 mm/18 s=2 m/min). Since the remaining cylindrical cams 40-42, 45-47 are controlled individually, it is possible that the front carrier system, e.g. carrier system 103 in the fifth step, separates from the rear carrier systems at an increased speed before the carrier system 103 then moves into the discharging chamber. Since the remaining cylindrical cams 40-42, 45-47 are controlled selectively, it is at the same time possible that a rear carrier system, e.g. carrier system 100 in the fifth step, can close the gap on the front carrier systems 101, 102 because of an increased speed. This becomes even clearer in FIGS. 10 and 11.

Figure 10:
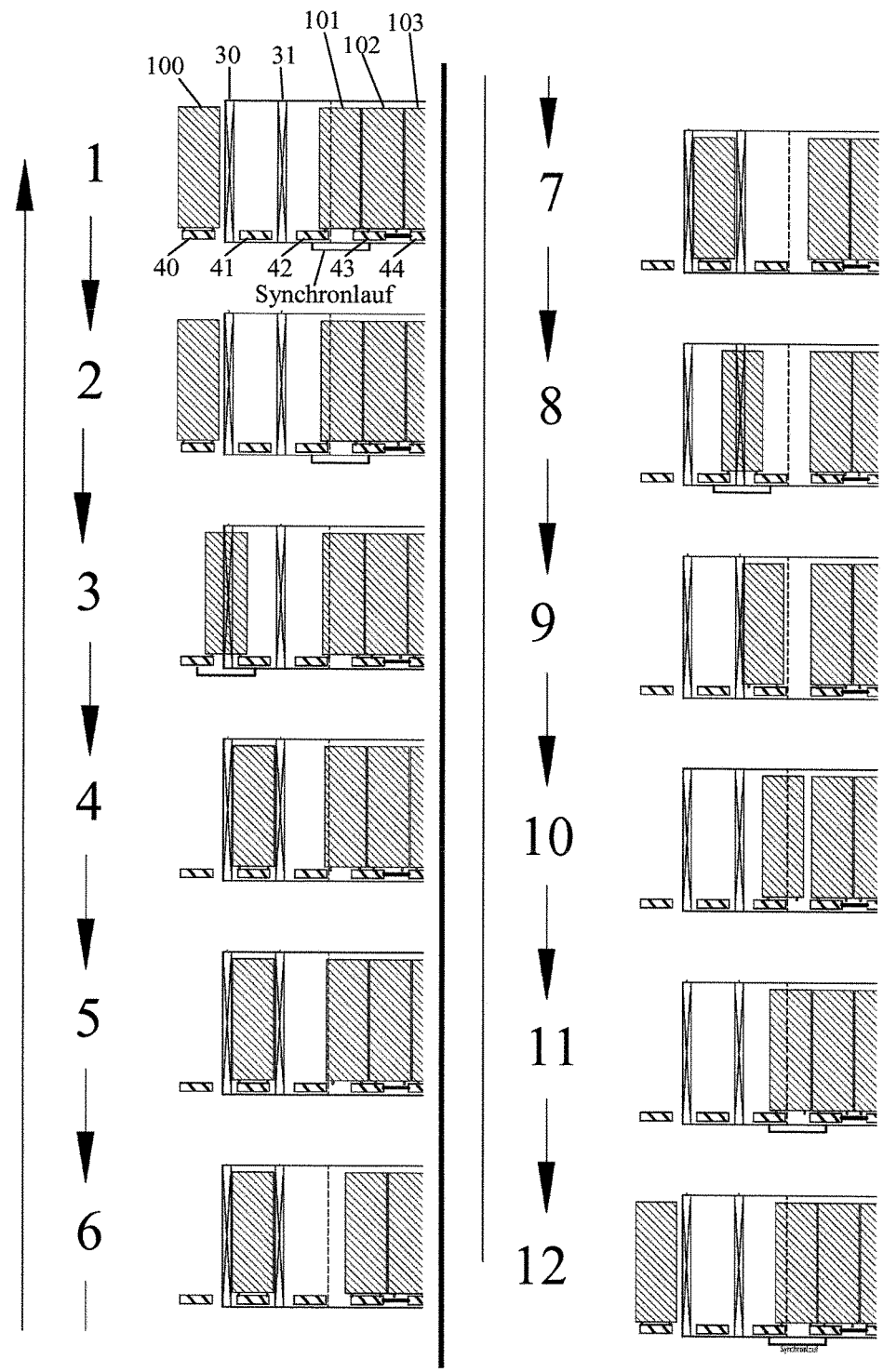
FIG. 10 shows a schematic second flow chart of the exemplary embodiment according to FIG. 8 of the solution according to the disclosure.

FIG. 10 shows a detailed flow chart, wherein only the front part of the overall system of FIG. 9 is shown. In the initial state (step 1), a carrier system 100 is in the loading station, the drive (cylindrical cam 40) stands still. The vacuum locks 30, 31 are closed and the charging chamber is empty. Flooding of the charging chamber has just been finished and the drive of the cylindrical cam 41 stands still. Train formation has taken place in the coating chamber, the cylindrical cams 42-44 are moving synchronously at the adjusted process speed. In the second step, the vacuum lock 30 is opened.

In the third step, the carrier system 100 moves from the loading station into the charging chamber. The cylindrical cams 40, 41 are moving synchronously at a high transport speed. In the coating chamber, the last carrier system 101 (or the last runner of the carrier system 101) has left the cylindrical cam 42 of the buffer chamber. In a fourth step, the carrier system 100 has moved into the charging chamber and the drive of the cylindrical cam 42 is stopped. The drive of the cylindrical cam 40 in the loading station is ready for taking up a new carrier system. In a fifth step, the vacuum lock 30 is closed. In a sixth step, the charging chamber is evacuated.

In a seventh step, the vacuum lock 31 is opened. In an eighth step, the cylindrical cams 41, 42 move synchronously at a fast transport speed. In a ninth step, the last runner of the carrier system 100 has left the cylindrical cam 41. The drive of the cylindrical cam 41 is thereupon decelerated, the drive of the cylindrical cam 42 of the buffer chamber is controlled such that the carrier system 100 closes the gap on the carrier system 101 in the coating chamber. In a tenth step, the vacuum lock 31 is closed.

In an eleventh step, the vacuum lock 31 is then already closed and the charging chamber can be flooded. The carrier system 100 has meanwhile closed the gap on the carrier system 101. The drive of the cylindrical cam 42 moves synchronously with the drive of the cylindrical cam 43. The twelfth step is identical to the state shown in the first step, i.e. the charging chamber is flooded and a new carrier system 105 is available in the loading station. Moving apart and discharging of the carrier systems are analogous to the method described above and can be taken from the chart of FIG. 11.

Figure 11:
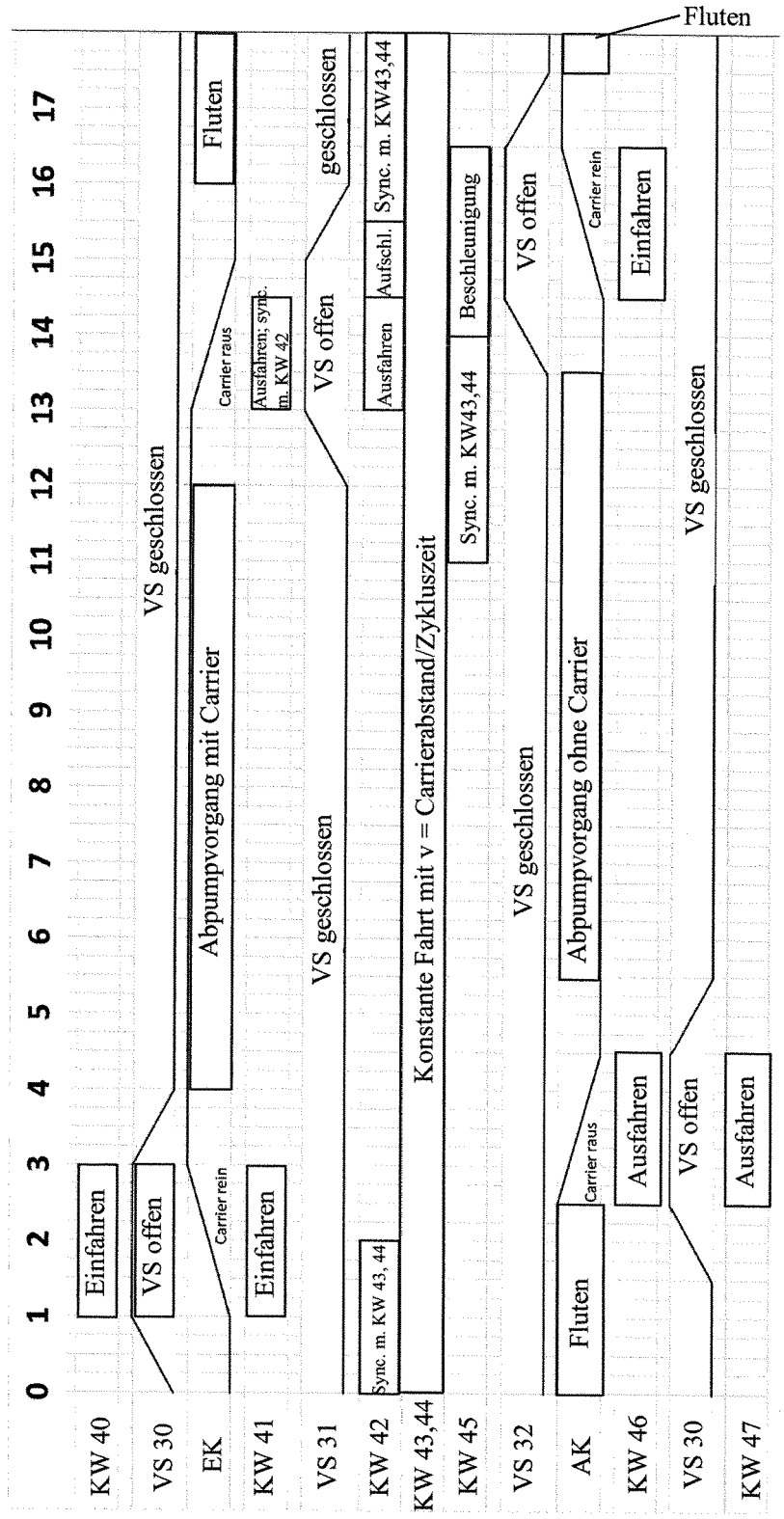
FIG. 11 shows a flow chart of the exemplary embodiment according to FIG. 8 of the solution according to the disclosure.

FIG. 11 shows a flow chart for the individual vacuum locks (VS) 30-33 (cf. FIG. 9), the cylindrical cams (KW) 40-47, as well as the states of the charging chamber (EK) and the discharging chamber (AK). As evident from FIG. 11, it is advantageously possible in accordance with this alternative embodiment to move the cylindrical cams 43, 44 at a constant speed in the coating chamber.

The exemplary embodiments described above can be realized equivalently both for carrier systems being orientated horizontally and carrier systems being orientated vertically. As already described, the systems can also be distinguished in accordance with the orientation of the carrier systems (carriers) (horizontal and vertical systems).

Figure 12:
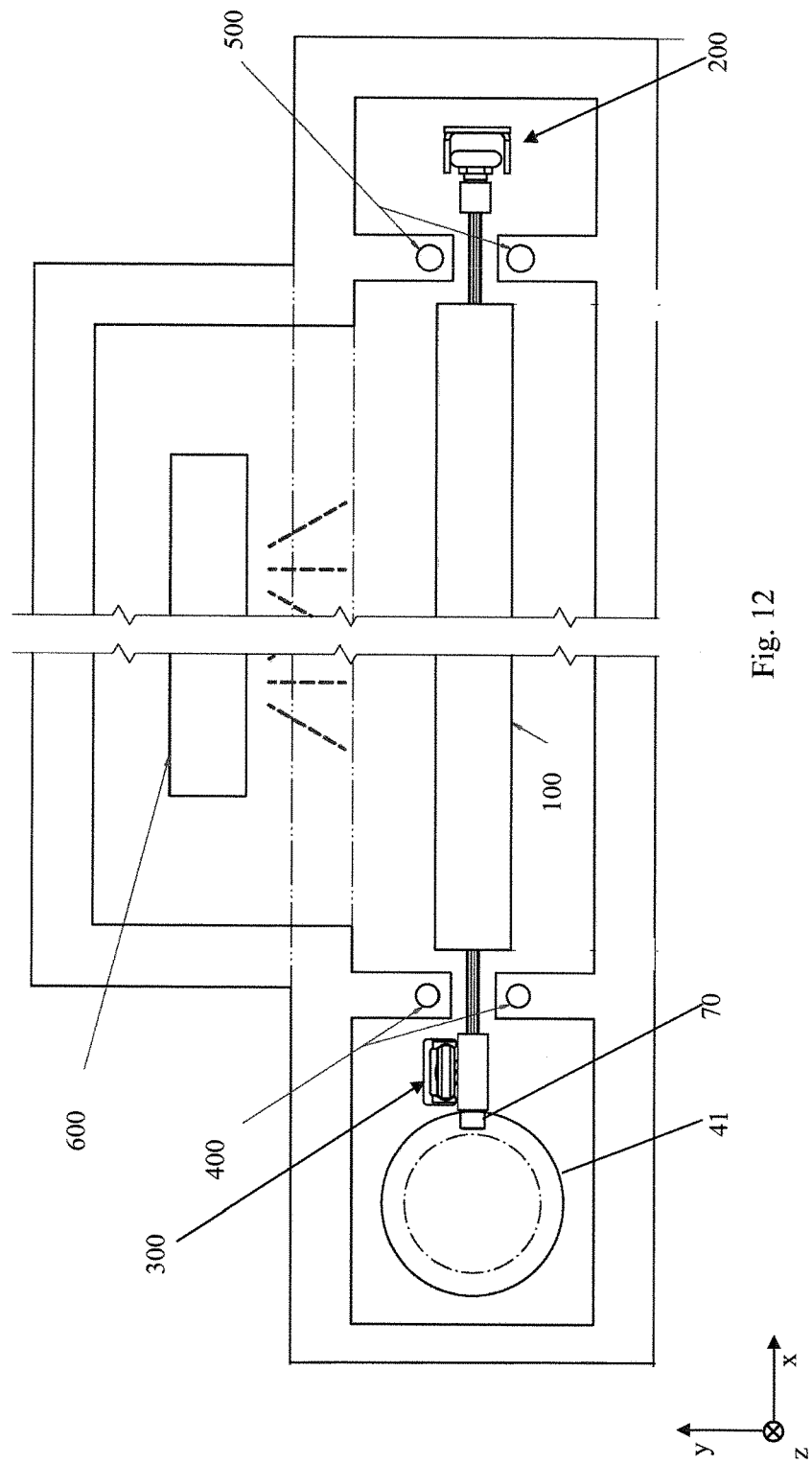
FIG. 12 shows a principle alternative structure of the interlocking drive device according to the disclosure.

FIG. 12 shows an interlocking drive similar to the drive shown in FIG. 7. The structure according to FIG. 12 is an example of a horizontal orientation of the carrier system 100.

In addition to the drive shown in FIG. 7, the embodiment according to FIG. 12 comprises guide elements 200, 300. Moreover, a cooler 400, 500 at the respective ends of the carrier system 100 as well as a coating source 600 are shown. Since the drive system according to the disclosure is slip-free and thus can transmit great drive forces, a friction-involving guide system which guarantees a precise straight running and avoids tilting of the carrier systems 10-12, 60-65, 100-105 can be used here for the carrier systems 10-12, 60-65, 100-105.

According to the disclosure, a first guide element 300 is realized at the drive side (at the side of the cylindrical cam 41) in a "fixed bearing", which can transmit forces in two directions perpendicularly to the transport plane and absorb torques in three directions. The first guide element 300 thus can only move in the transport direction. At the opposite end there is a second guide element 200, which is realized as "loose bearing" and which serves for supporting tilting forces and allows a thermal expansion of the carrier system 100. In the horizontal variant, the guide elements are arranged parallel with respect to both the transport plane and the transport direction.

Also in this embodiment, the transport direction (z-direction) extends along the cylinder axis of the cylindrical cam 41. The transport plane is clearly defined by the transport direction (z-axis) and the radius of the cylindrical cam 41 relative to the engagement point of the connecting element 70 with the groove or the curved web (x-axis). In the horizontal orientation, the transport plane can alternatively also be defined as a plane which is defined by the transport direction (z-direction) and the connection between the center of the cylindrical cam 41 and the second guide element 200. It has already been stated that this definition of the transport plane is applicable in particular to the embodiment shown here. However, other embodiments of the present disclosure can deviate from this definition, e.g., in case a non-straight connecting element 70 (elbowed or angled connecting elements) is used, in which the engagement point of the connecting element 70 does not lie in the transport plane.

The additional guide system, comprising the guide elements 200, 300, is particularly advantageous in the embodiments of FIGS. 9 to 11, in which the carrier systems 100-105 are wider than long, i.e. are moved with the long side forward through the continuous system.

In almost all other known drive systems, the carrier systems lie on the driving rollers because of their own weight (as already described above). A separate guide system thus cannot be used in such systems because friction of this guide system is variable and, therefore, the feed caused by friction would be changed by the friction of the guide system. By using the guide elements 200, 300 according to FIG. 12, it is advantageously possible in accordance with the disclosure to use carrier systems having a length to width ratio of preferably 0.3-0.5:1, so that the system can be designed clearly shorter.

The guide elements 200, 300 can of course also be used for carrier systems being orientated vertically. In carrier systems being orientated vertically, the height (along the y-axis) is greater as compared to the length (along the z-axis) and/or width (along the x-axis). This leads to similar problems as those occurring in connection with the different length to width ratio described above. In case of a vertical orientation, the guide element 200 is then arranged at the lower side of the carrier system and the guide element 300 at the upper side of the carrier system, i.e. the guide elements 200, 300 are in this case arranged along the y-axis.

The exemplary embodiments of the present disclosure described above can be used for different processes in different transport systems. The method is adapted to the different conditions of the different processes in the transport systems without leaving the scope of the present disclosure. For example, a mechanical connection between the cylindrical cams 40, 41, 43, 44 could be realized, so that they could use only one motor for driving.

While the present disclosure has been described and shown herein with reference to its preferred embodiments, it is clear to persons skilled in this technical field that different modifications and changes can be made without leaving the scope of the disclosure. In this manner it is intended that the present disclosure covers the modifications and changes of this disclosure as far as they are covered by the scope of protection of the enclosed claims and their equivalents.

What is claimed is:

1. A continuous system comprising:
    at least one carrier system comprising at least two connecting elements;
    a plurality of transport systems arranged one after the other in the transport direction (z-direction) in a transport plane (x-z-plane), wherein the transport systems each have a cylindrical cam being axially parallel with respect to the transport direction, wherein the cylindrical cams have a central region having a first diameter $d_1$ and at least a second diameter $d_2$ at the ends of the cylindrical cams, wherein $d_2<d_1$, wherein the distance between two successive central regions of the cylindrical cams is smaller than the distance between the at least two connecting elements of a carrier system, wherein in the central region, the cylindrical cams have a helical groove or a helically curved web, and the connecting elements of the carrier system engage interlockingly with the groove of the cylindrical cam or encompass the curved web, wherein the transport systems comprise at least one processing chamber with at least two vacuum locks for a vacuum operation of the processing chamber, wherein the processing chamber comprises an inner chamber wall, wherein the processing chamber comprises a recess in which the cylindrical cam is arranged, wherein a distance a of the cylindrical cam axis relative to the inner chamber wall lies in the range of $d_2/2<a<d_1/2$, and
    at least one drive unit for driving the cylindrical cams.

2. The continuous system according to claim 1, wherein the connecting element comprises at least one or more runners which are supported so as to be rotatable.

3. The continuous system according to claim 1, wherein the connecting element comprises a pin-shaped element.

4. The continuous system according to claim 1, wherein the transport systems comprise a loading and unloading chamber.

5. The continuous system according to claim 1, wherein the transport systems comprise a charging and discharging chamber.

6. The continuous system according to claim 5, wherein the charging and discharging chamber comprises at least two vacuum locks for a vacuum operation of the chambers.

7. The continuous system according to claim 1, wherein each of the plurality of transport systems comprises an own drive unit.

8. The continuous system according to claim 1, wherein the drive units or cylindrical cams each have an encoder for determining the position of the carrier systems.

9. The continuous system according to claim 1, wherein the at least one carrier system longer in the transport direction than perpendicularly to the transport direction in the transport plane and longer than perpendicularly to the transport plane.

10. The continuous system according to claim 1, wherein the at least one carrier system is shorter in the transport direction in the transport plane than perpendicularly to the transport direction in the transport plane and/or shorter than perpendicularly to the transport plane, preferably at a ratio of 0.3-0.5:1.

11. The continuous system according to claim 10, comprising a friction-involving guide system which preferably comprises a first guide element and a second guide element, wherein the first guide element is arranged at the side of the carrier system with the connecting element and the second guide element is arranged at the opposite side of the carrier system.

12. The continuous system according to claim 1, wherein the processing chamber comprises at least one first buffer chamber, at least one process chamber following the at least one first buffer chamber and at least one second buffer chamber following the at least one process chamber.

13. The continuous system according to claim 1, comprising means for individually controlling the plurality of transport systems for a continuous running of the carrier systems in the processing chamber and/or for adjusting a predetermined distance between the successively arranged carrier systems.

14. The continuous system according to claim 1, wherein at least one end of the cylindrical cams with the diameter $d_2$ is led outwardly through at least one wall of the recess in order to be driven there by the drive unit.

15. The continuous system according to claim 1, wherein the distance a of the cylindrical cam axis relative to the inner wall of the chamber is equal to the sum of a chamber wall thickness w, the radius of the drive pinion/functional element r/2 and a gap between the functional element and the chamber wall s.

* * * * *